United States Patent
Mikado et al.

(10) Patent No.: US 10,143,092 B2
(45) Date of Patent: Nov. 27, 2018

(54) CIRCUIT SUBSTRATE AND METHOD FOR MANUFACTURING THE SAME

(71) Applicant: IBIDEN CO., LTD., Ogaki (JP)

(72) Inventors: Yukinobu Mikado, Ogaki (JP); Mitsuhiro Tomikawa, Ogaki (JP); Koji Asano, Ogaki (JP); Kotaro Takagi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 15/044,295

(22) Filed: Feb. 16, 2016

(65) Prior Publication Data

US 2016/0242293 A1 Aug. 18, 2016

(30) Foreign Application Priority Data

Feb. 13, 2015 (JP) ................................. 2015-026082

(51) Int. Cl.
*H05K 1/02* (2006.01)
*H05K 3/46* (2006.01)
(Continued)

(52) U.S. Cl.
CPC ......... *H05K 3/4697* (2013.01); *H05K 1/0204* (2013.01); *H05K 1/0206* (2013.01); *H01L 2224/48091* (2013.01); *H01L 2224/48227* (2013.01); *H01L 2924/15311* (2013.01); *H05K 1/182* (2013.01); *H05K 1/185* (2013.01);
(Continued)

(58) Field of Classification Search
CPC ............... H05K 3/4697; H05K 1/0206; H05K 2201/10734; H05K 1/185; H05K 3/3436; H05K 3/4661; H05K 2201/10015; H05K 2201/10416
See application file for complete search history.

(56) References Cited

U.S. PATENT DOCUMENTS 5,642,261 A * 6/1997 Bond .................. H01L 23/3128
257/707
8,772,646 B2 * 7/2014 Ueda .................. H01L 23/49816
174/252
(Continued)

FOREIGN PATENT DOCUMENTS

JP 2013-135168 A 7/2013

*Primary Examiner* — Ishwarbhai B Patel
(74) *Attorney, Agent, or Firm* — Oblon, McClelland, Maier & Neustadt, L.L.P.

(57) ABSTRACT

A circuit substrate includes a core substrate having a cavity penetrating through the substrate, a metal block accommodated in the cavity of the substrate, a first build-up layer laminated on first side of the substrate and including insulating resin layers such that the first build-up layer is covering first surface of the block from the first side, and a second build-up layer laminated on second side of the substrate and including insulating resin layers such that the second build-up layer is covering second surface of the block from the second side. The first build-up layer includes an electronic component mounting structure formed on outermost portion of the first build-up layer, and the block is formed such that the first and second surfaces have roughened surfaces, respectively, and that the roughened surface of the first surface has surface roughness different from surface roughness of the roughened surface of the second surface.

20 Claims, 16 Drawing Sheets

(51) Int. Cl.
*H05K 1/18* (2006.01)
*H05K 3/34* (2006.01)

(52) U.S. Cl.
CPC ......... *H05K 3/3436* (2013.01); *H05K 3/4661* (2013.01); *H05K 2201/10015* (2013.01); *H05K 2201/10416* (2013.01); *H05K 2201/10734* (2013.01)

(56) References Cited

U.S. PATENT DOCUMENTS

| | | | | |
|---|---|---|---|---|
| 8,859,908 | B2 * | 10/2014 | Wang | H05K 1/0206 174/252 |
| 9,661,738 | B1 * | 5/2017 | Jacobsson | H05K 1/0206 |
| 2002/0189853 | A1 * | 12/2002 | Hsu | H01L 23/3677 174/252 |
| 2006/0110898 | A1 * | 5/2006 | Lauffer | H01L 21/4857 438/584 |
| 2008/0273313 | A1 * | 11/2008 | Wang | H01L 23/5389 361/761 |
| 2014/0251658 | A1 * | 9/2014 | Lin | H05K 1/0271 174/252 |
| 2014/0355215 | A1 * | 12/2014 | Canete | H05K 3/30 361/720 |

\* cited by examiner

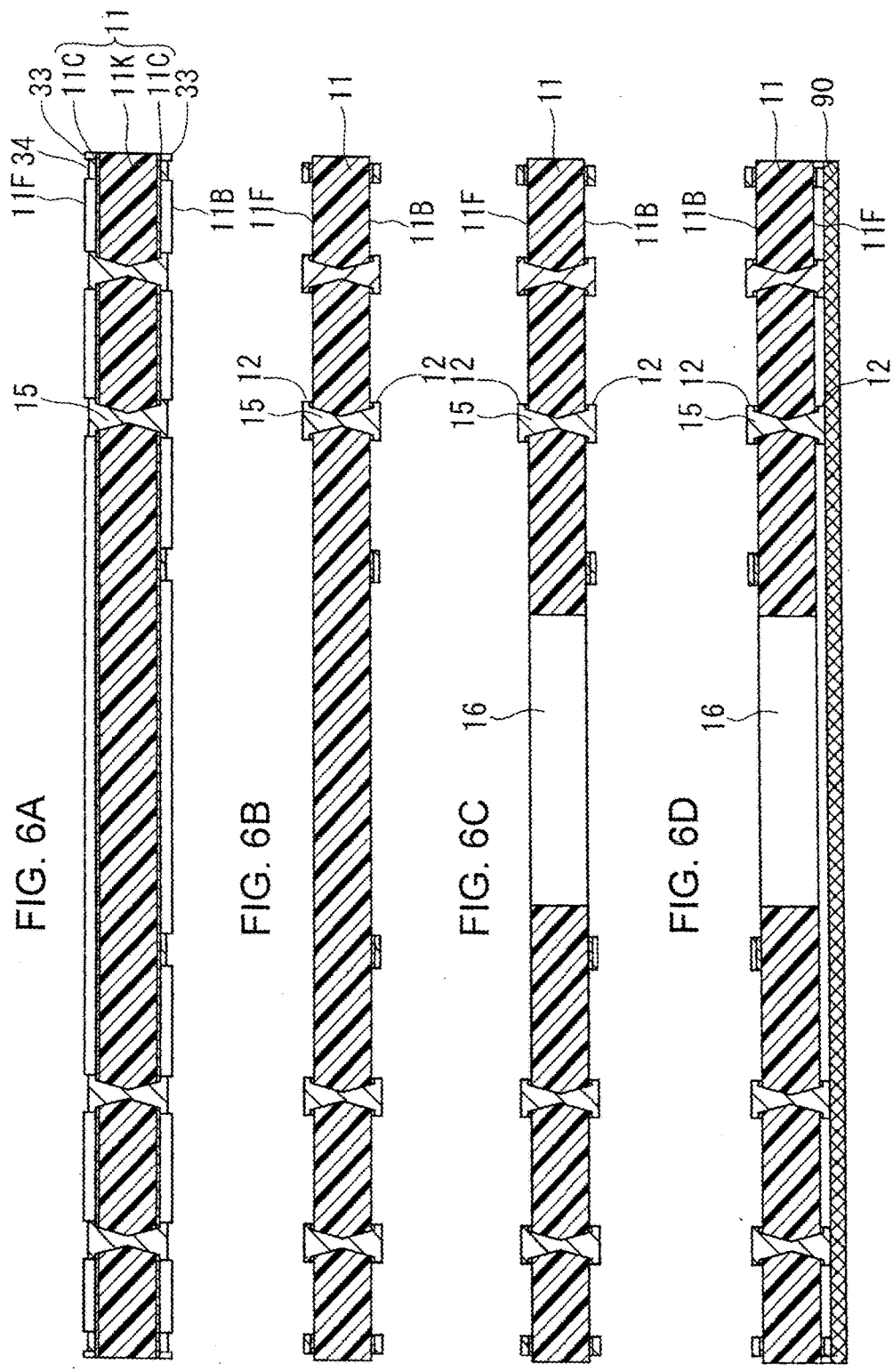

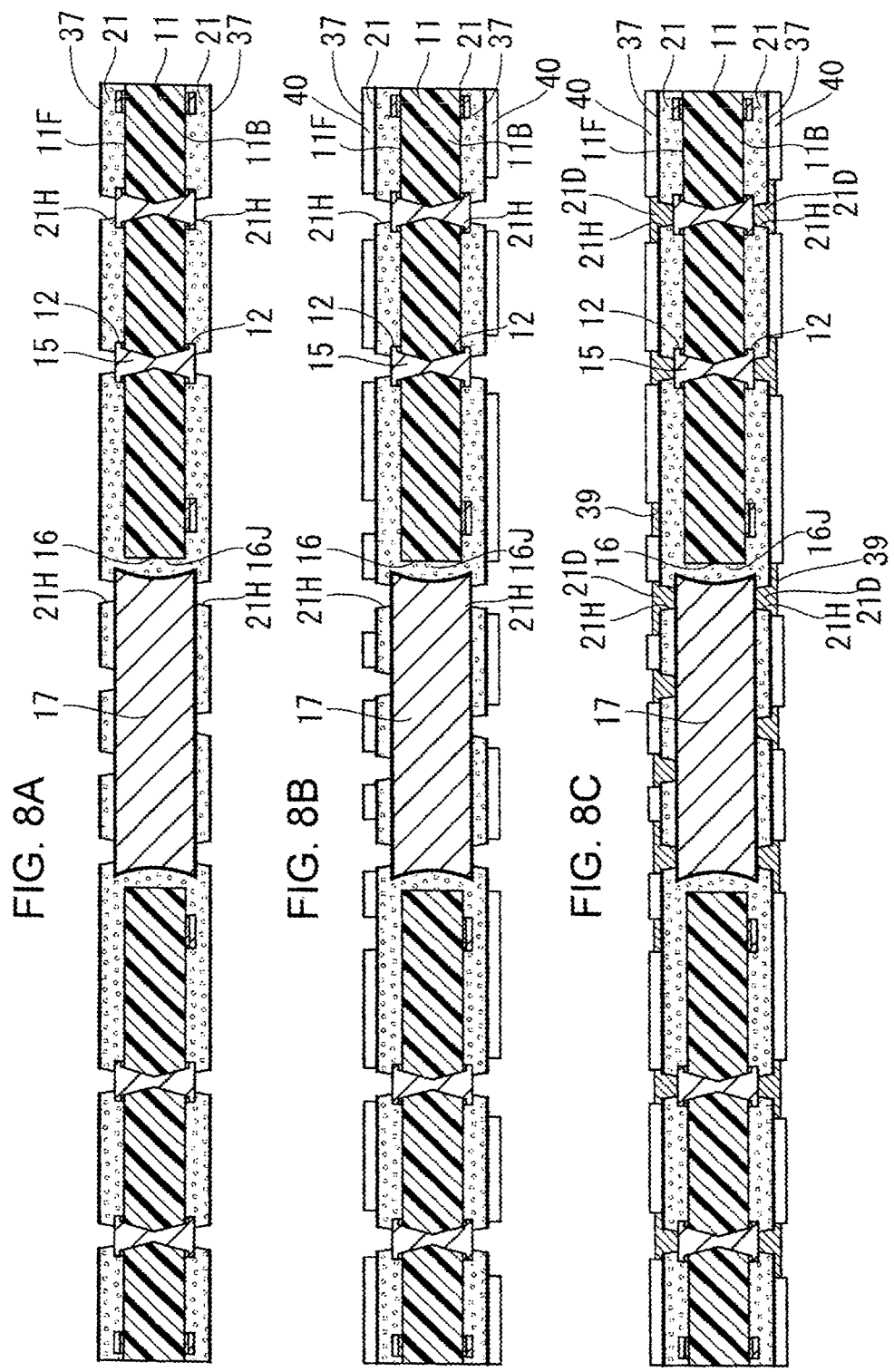

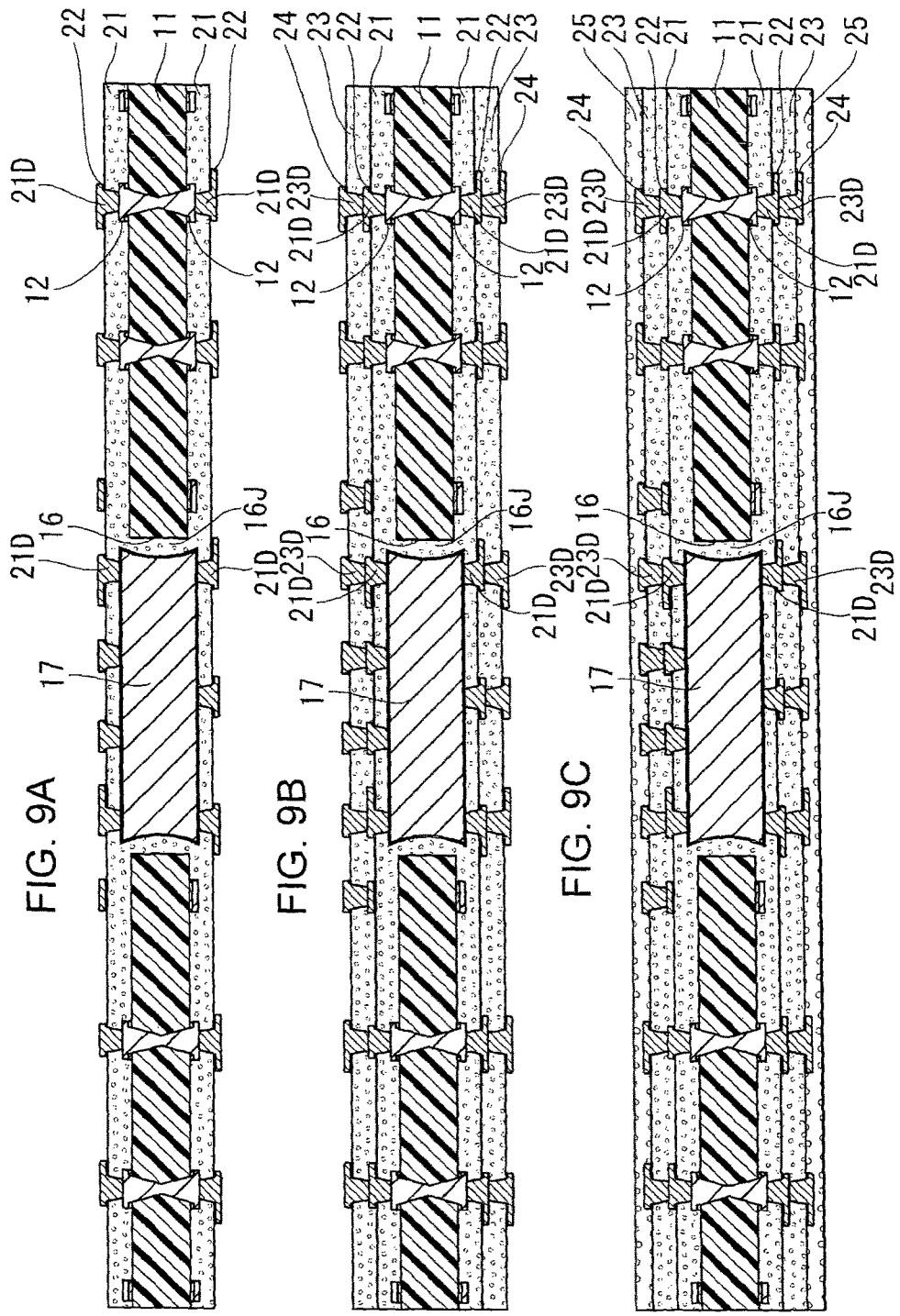

CIRCUIT SUBSTRATE AND METHOD FOR MANUFACTURING THE SAME

CROSS-REFERENCE TO RELATED APPLICATIONS

The present application is based upon and claims the benefit of priority to Japanese Patent Application No. 2015-026082, filed Feb. 13, 2015, the entire contents of which are incorporated herein by reference.

BACKGROUND OF THE INVENTION

Field of the Invention

The present invention relates to a circuit substrate in which a build-up layer is laminated on a core substrate that has a cavity, and to a method for manufacturing the circuit substrate.

Description of Background Art

Japanese Patent Laid-Open Publication No. 2013-135168 describes a circuit substrate in which both front and back surfaces of a metal block accommodated in a cavity are respectively fixed by insulating resin layers contained in build-up layers. The entire contents of this publication are incorporated herein by reference.

SUMMARY OF THE INVENTION

According to one aspect of the present invention, a circuit substrate includes a core substrate having a cavity formed such that the cavity is penetrating through the core substrate, a metal block accommodated in the cavity of the core substrate, a first build-up layer laminated on a first side of the core substrate and including insulating resin layers such that the first build-up layer is covering a first surface of the metal block in the cavity of the core substrate from the first side, and a second build-up layer laminated on a second side of the core substrate on the opposite side with respect to the first side and including insulating resin layers such that the second build-up layer is covering a second surface of the metal block in the cavity of the core substrate from the second side. The first build-up layer includes an electronic component mounting structure formed on an outermost portion of the first build-up layer such that the electronic component mounting structure mounts an electronic component on the first build-up layer, and the metal block is formed such that the first and second surfaces of the metal block have roughened surfaces, respectively, and that the roughened surface of the first surface has a surface roughness which is different from a surface roughness of the roughened surface of the second surface.

According to another aspect of the present invention, a method for manufacturing a circuit substrate includes forming a cavity in a core substrate such that the cavity penetrates through the core substrate, accommodating, in the cavity of the core substrate, a metal block having first and second surfaces having roughened surfaces, respectively, such that the roughened surface of the first surface has a surface roughness which is different from a surface roughness of the roughened surface of the second surface, forming, on a first side of the core substrate, a first build-up layer including insulating resin layers such that the first build-up layer covers the first surface of the metal block in the cavity of the core substrate from the first side, and forming, a second side of the core substrate, a second build-up layer including insulating resin layers on the opposite side with respect to the first side such that the second build-up layer covers the second surface of the metal block in the cavity of the core substrate from the second side. The forming of the first build-up layer includes forming an electronic component mounting structure on an outermost portion of the first build-up layer such that the electronic component mounting structure mounts an electronic component on the first build-up layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 6A-6D are cross-sectional side views illustrating manufacturing processes of the circuit substrate;

FIG. 8A-8C are cross-sectional side views illustrating manufacturing processes of the circuit substrate;

FIG. 9A-9C are cross-sectional side views illustrating manufacturing processes of the circuit substrate;

DETAILED DESCRIPTION OF THE EMBODIMENTS

Figure 1:
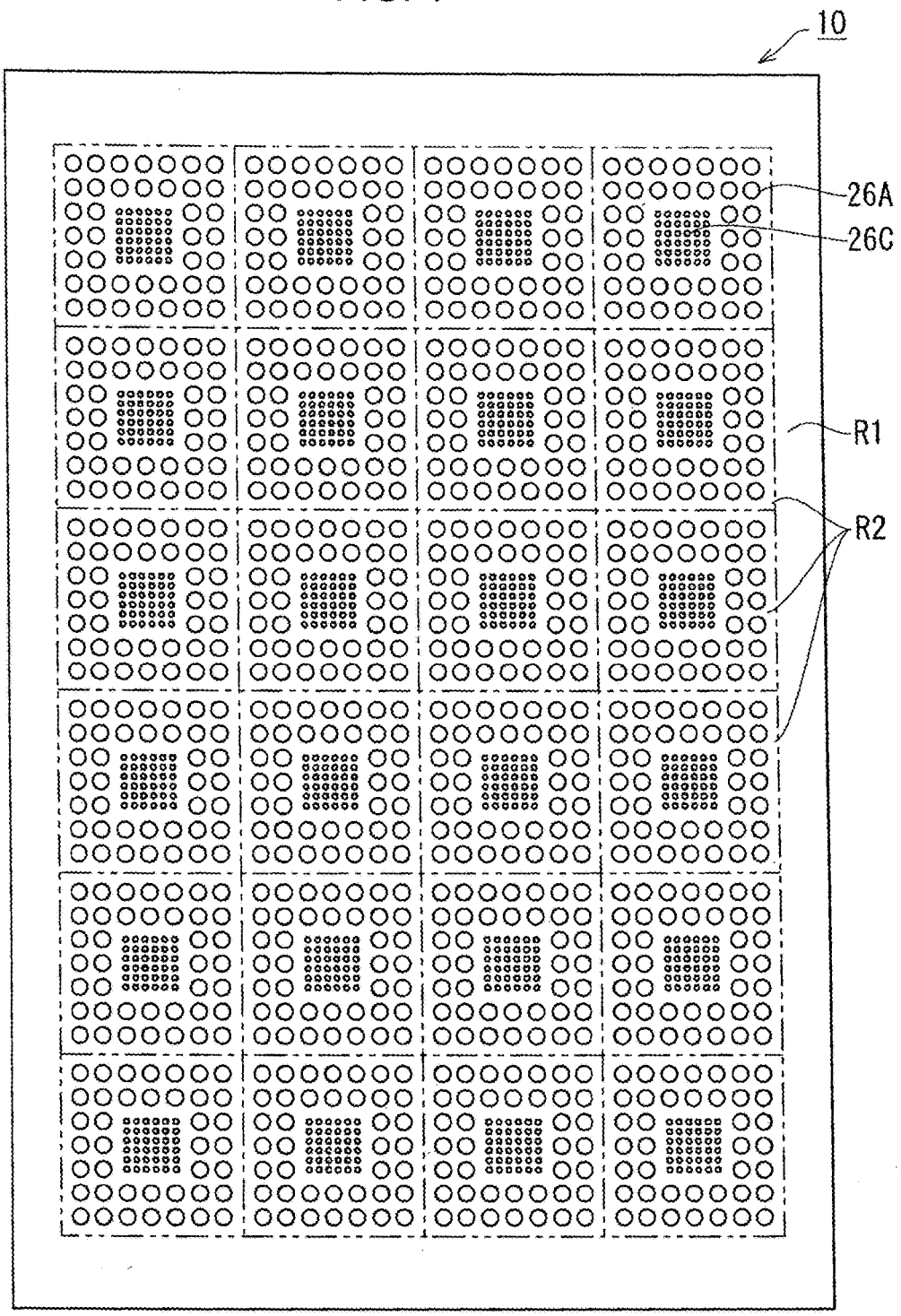
FIG. 1 is a plan view of a circuit substrate according to a first embodiment of the present invention.

The embodiments will now be described with reference to the accompanying drawings, wherein like reference numerals designate corresponding or identical elements throughout the various drawings.

First Embodiment

Figure 2:
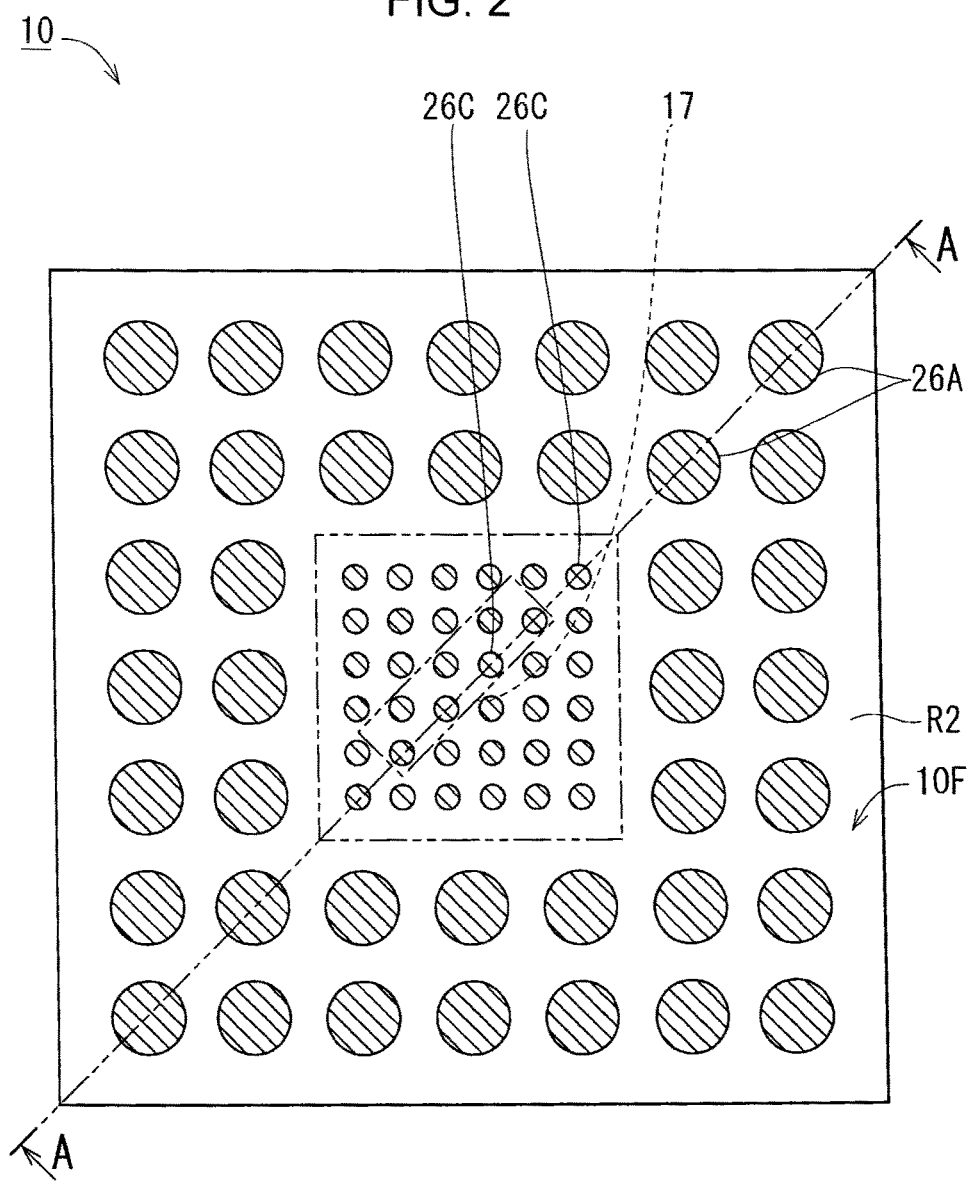
FIG. 2 is a plan view of a product region in the circuit substrate.
Figure 3:
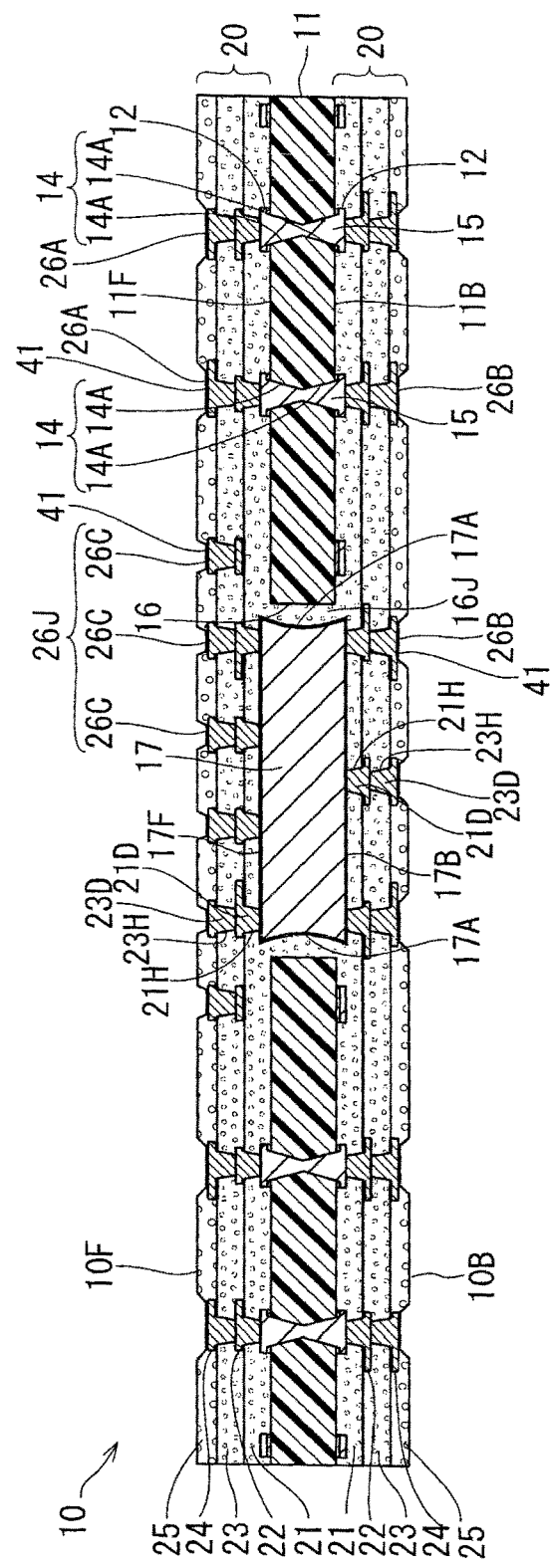
FIG. 3 is cross-sectional side view of the circuit substrate in an A-A cutting plane of FIG. 2.

In the following, a first embodiment of the present invention is described based on FIG. 1-13. As illustrated in a plan view of FIG. 1, a circuit substrate 10 of the present embodiment has, for example, a frame-shaped discard region (R1) along an outer edge, and an inner side of the discard region (R1) is divided into multiple square product regions (R2). FIG. 2 illustrates an enlarged view of one product region (R2). FIG. 3 illustrates an enlarged view of a cross-sectional structure of the circuit substrate 10, the cross section being taken by cutting the product region (R2) along a diagonal line.

As illustrated in FIG. 3, the circuit substrate 10 is structured to respectively have build-up layers (20, 20) on front and back surfaces of a core substrate 11. The core substrate 11 is formed of an insulating member. A conductor circuit layer 12 is formed on each of an F surface (11F), which is the front side surface of the core substrate 11, and a B surface (11B), which is the back side surface of the core substrate 11. Further, a cavity 16 and electrical conduction through holes 14 are formed in the core substrate 11.

The electrical conduction through holes 14 are each formed in a middle-constricted shape in which small diameter side ends of tapered holes (14A, 14A) are communicatively connected, the tapered holes (14A, 14A) being respective formed by drilling from the F surface (11F) and the B surface (11B) of the core substrate 11 and being gradually reduced in diameter toward a deep side. On the other hand, the cavity 16 is formed in a shape that has a space in a shape of a rectangular cuboid.

The electrical conduction through holes 14 are filled with plating and through-hole electrical conductors 15 are respectively formed. The conductor circuit layer 12 on the F surface (11F) and the conductor circuit layer 12 on the B surface (11B) are connected by the through-hole electrical conductors 15.

A metal block 17 is accommodated in the cavity 16. The metal block 17 is, for example, a copper cuboid. A planar shape of the metal block 17 is slightly smaller than a planar shape of the cavity 16. Further, a thickness of the metal block 17, that is, a distance between a first primary surface (17F) (which is one of front and back surfaces of the metal block 17) and a second primary surface (17B) (which is the other one of the front and back surfaces of the metal block 17), is slightly larger than a plate thickness of the core substrate 11. Then, the metal block 17 slightly protrudes from both the F surface (11F) and the B surface (11B) of the core substrate 11. The first primary surface (17F) of the metal block 17 is substantially flush with an outermost surface of the conductor circuit layer 12 on the F surface (11F) of the core substrate 11, and the second primary surface (17B) of the metal block 17 is substantially flush with an outermost surface of the conductor circuit layer 12 on the B surface (11B) of the core substrate 11. Further, a gap between the metal block 17 and an inner surface of the cavity 16 is filled with a filling resin (16J) according to an embodiment of the present invention.

The first primary surface (17F) and the second primary surface (17B) of the metal block 17 have substantially the same area and are parallel to each other. Further, four side surfaces of the metal block 17 between an outer edge of the first primary surface (17F) and an outer edge of the second primary surface (17B) are groove-shaped side surfaces (17A) (corresponding to "side surfaces" according to an embodiment of the present invention) that are each curved so as to increase in depth toward a center between the first primary surface (17F) and the second primary surface (17B).

Figure 4:
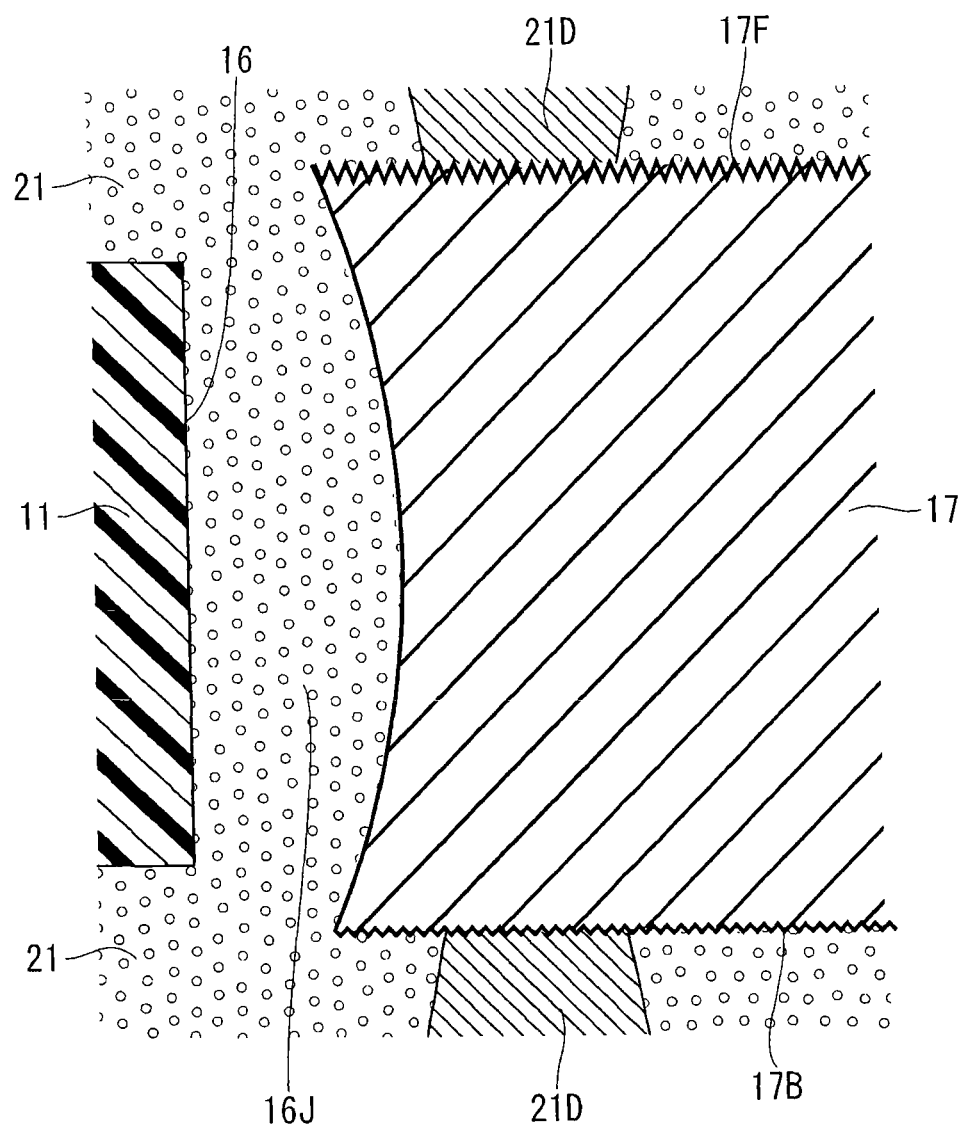
FIG. 4 is an enlarged cross-sectional side view of a portion around an end part of a metal block.

FIG. 4 illustrates an enlarged view of a portion of the metal block 17. As illustrated in FIG. 4, the first primary surface (17F) and the second primary surface (17B) of the metal block 17 (that is, both front and back surfaces of the metal block 17) are rough surfaces. Specifically, the first primary surface (17F) of the metal block 17 has an arithmetic average roughness (Ra) of, for example, 2.1 μm, and the second primary surface (17B) has an arithmetic average roughness (Ra) of, for example, 0.16 μm. The roughness of the first primary surface (17F) of the metal block 17 is larger than the roughness of the second primary surface (17B) (according to a definition of JIS B 0601-1994).

As illustrated in FIG. 3, both the build-up layer 20 on the F surface (11F) side of the core substrate 11 and the build-up layer 20 on the B surface (11B) side are formed by sequentially laminating, from the core substrate 11 side, a first insulating resin layer 21, a first conductor layer 22, a second insulating resin layer 23 and a second conductor layer 24. A solder resist layer 25 is laminated on the second conductor layer 24. Further, via holes (21H) and via holes (23H) are respectively formed in the first insulating resin layer 21 and the second insulating resin layer 23. The via holes (21H, 23H) are all formed in a tapered shape that is gradually reduced in diameter toward the core substrate 11 side. Further, the via holes (21H, 23H) are filled with plating and via conductors (21D, 23D) are formed. Then, the conductor circuit layer 12 and the first conductor layer 22, and, the metal block 17 and the first conductor layer 22, are connected by the via conductors (21D) of the first insulating resin layer 21; and the first conductor layer 22 and the second conductor layer 24 are connected by the via conductors (23D) of the second insulating resin layer 23. Further, pad holes are formed in the solder resist layer 25, and a portion of the second conductor layer 24 positioned in each of the pad holes becomes a pad 26. Here, a diameter (top diameter) of via conductors (21D) that connect the conductor circuit layer 12 and the first conductor layer 22 and a diameter (top diameter) of via conductors (21D) that connect the metal block 17 and the first conductor layer 22 may be substantially the same or may be different.

On an F surface (10F) of the circuit substrate 10 (the F surface (10F) being an outermost surface of the build-up layer 20 on the F surface (11F) of the core substrate 11), the pads 26 include a group of medium pads (26A) that are arrayed in two rows along an outer edge of the product region (R2) and a group of small pads (26C) that are arrayed in multiple vertical and horizontal rows in an inner side region surrounded by the group of the medium pads (26A). Further, an electronic component mounting part (26J) according to an embodiment of the present invention is formed from the group of the small pads (26C). Further, for example, as illustrated in FIG. 2, the metal block 17 is placed at a position directly below a total of seven small pads (26C) including four small pads (26C) that are aligned on a diagonal line of the product region (R2) at a center of the group of the small pads (26C) and three small pads (26C) that are aligned parallel to the diagonal line next to the array of the four small pads (26C). Then, among the seven small pads (26C), as illustrated in FIG. 3, for example, four small pads (26C) are connected via eight via conductors (21D, 23D) to the metal block 17. In contrast, on a B surface (10B) of the circuit substrate 10 (the B surface (10B) being an outermost surface of the build-up layer 20 on the B surface (11B) of the core substrate 11), three large pads (26B) that are larger than the medium pads (26A) form a substrate connecting part according to an embodiment of the present invention, and are connected via six via conductors (21D, 23D) to the metal block 17. That is, in the circuit substrate 10 of the present embodiment, the number of the via conductors (21D) that are connected to the metal block 17 is greater in the build-up layer 20 on the F surface (11F) side of the core substrate 11 than in the build-up layer 20 on the B surface (11B) side.

The circuit substrate 10 of the present embodiment is manufactured as follows.

Figure 5A:
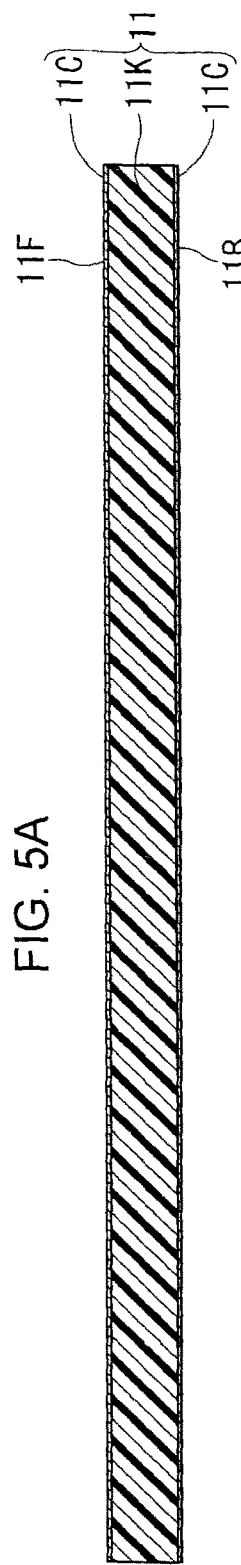
FIG. 5A-5D are cross-sectional side views illustrating manufacturing processes of the circuit substrate.

(1) As illustrated in FIG. 5A, a substrate as the core substrate 11 is prepared that is obtained by laminating a copper foil (11C) on both front and back surfaces of an insulating base material (11K) that is made of epoxy resin or BT (bismaleimide triazine) resin and a reinforcing material such as a glass cloth.

Figure 5B:
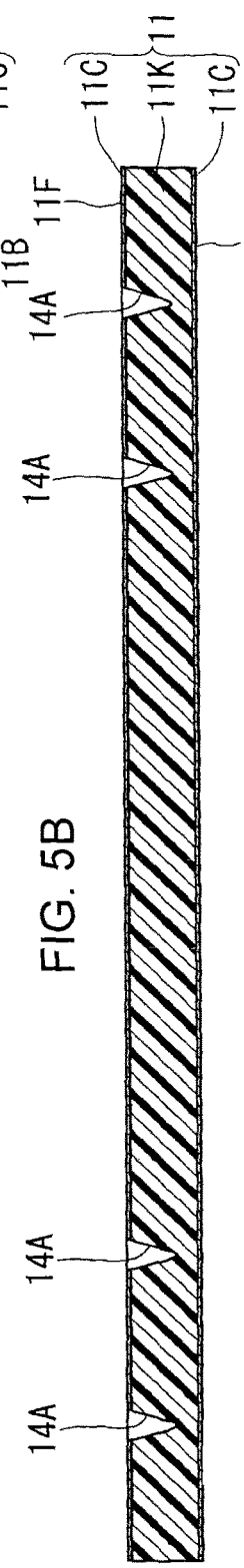

(2) As illustrated in FIG. 5B, the tapered holes (14A) for forming the electrical conduction through holes 14 (see FIG. 3) are drilled by irradiating, for example, CO2 laser to the core substrate 11 from the F surface (11F) side.

Figure 5C:
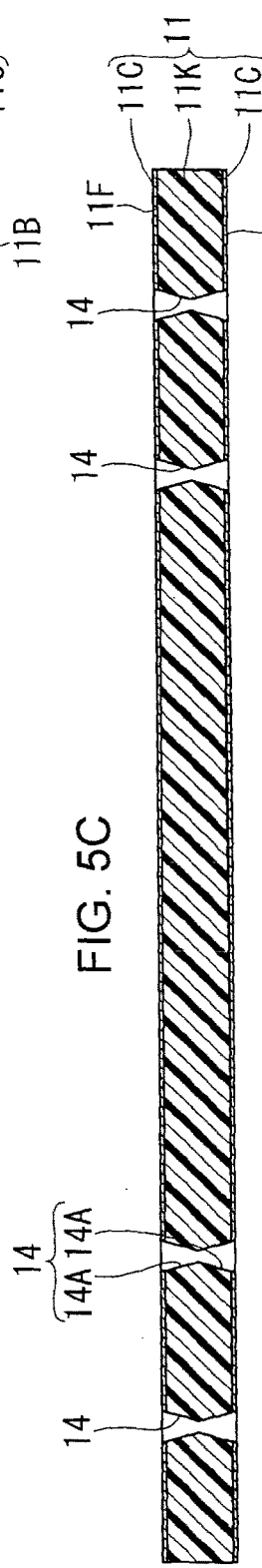

(3) As illustrated in FIG. 5C, the tapered holes (14A) are drilled on the B surface (11B) side of the core substrate 11 by irradiating CO2 laser to positions directly on the back of the above-described tapered holes (14A) on the F surface (11F) side. The electrical conduction through holes 14 are formed from the tapered holes (14A, 14A).

(4) An electroless plating treatment is performed. An electroless plating film (not illustrated in the drawings) is formed on the copper foil (11C) and on inner surfaces of the electrical conduction through holes 14.

Figure 5D:
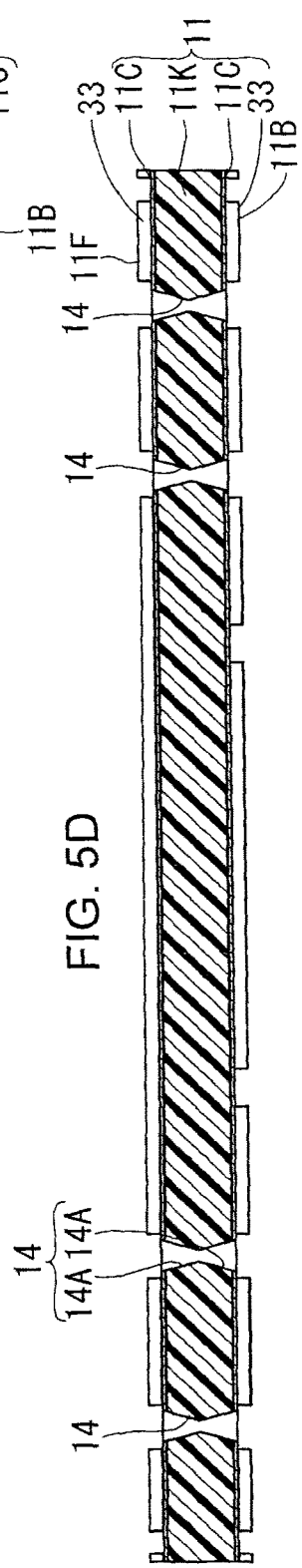

(5) As illustrated in FIG. 5D, a plating resist 33 of a predetermined pattern is formed on the electroless plating film on the copper foil (11C).

(6) An electrolytic plating treatment is performed. As illustrated in FIG. 6A, the electrical conduction through holes 14 are filled with electrolytic plating and the through-hole electrical conductors 15 are formed; and an electrolytic plating film 34 is formed on a portion of the electroless plating film (not illustrated in the drawings) on the copper foil (11C), the portion being exposed from the plating resist 33.

(7) The plating resist 33 is peeled off, and the electroless plating film (not illustrated in the drawings) and the copper foil (11C), which are below the plating resist 33, are removed. As illustrated in FIG. 6B, by the remaining electrolytic plating film 34, electroless plating film and copper foil (11C), the conductor circuit layer 12 is formed on the F surface (11F) of the core substrate 11, and the conductor circuit layer 12 is formed on the B surface (11B) of the core substrate 11. Then, the conductor circuit layer 12 on the F surface (11F) and the conductor circuit layer 12 on the B surface (11B) are in a state of being connected by the through-hole electrical conductors 15.

(8) As illustrated in FIG. 6C, the cavity 16 is formed in the core substrate 11 using a router or CO2 laser.

(9) As illustrated in FIG. 6D, a tape 90 made of a PET film is affixed to the F surface (11F) of the core substrate 11 so as to close the cavity 16.

(10) The metal block 17 that is manufactured using a method to be described later and of which the front and back surfaces have different roughness is prepared. In this case, metal blocks 17 are positioned in advance, for example, in a state in which the first primary surface (17F) (surface having a larger roughness) of each of the metal blocks 17 faces downward.

Figure 7A:
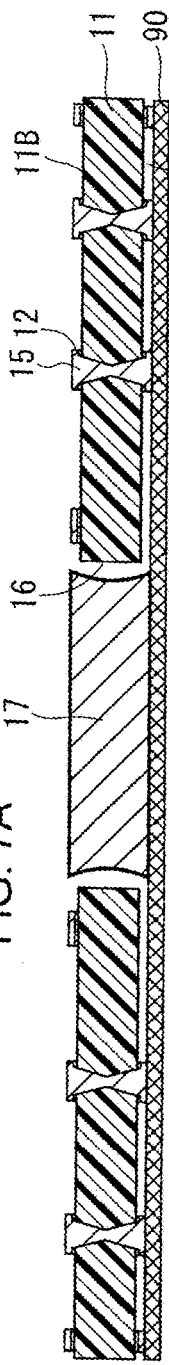
FIG. 7A-7D are cross-sectional side views illustrating manufacturing processes of the circuit substrate.

(11) As illustrated in FIG. 7A, the metal block 17 is accommodated in the cavity 16 using a mounter (not illustrated in the drawings) such that the first primary surface (17F) faces downward.

Figure 7B:
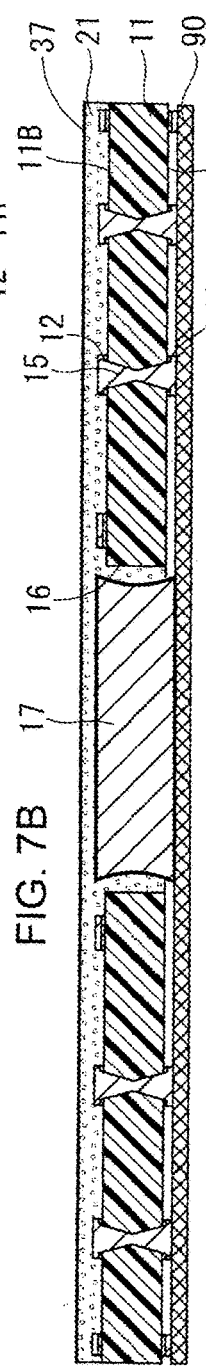

(12) As illustrated in FIG. 7B, a prepreg (a resin sheet of a B-stage formed by impregnating a core material with resin) as the first insulating resin layer 21 and a copper foil 37 are laminated on the conductor circuit layer 12 on the B surface (11B) of the core substrate 11, and then, the resulting substrate is hot-pressed. In doing so, spacing between the conductor circuit layers (12, 12) on the B surface (11B) of the core substrate 11 is filled with the prepreg, and a gap between an inner surface of the cavity 16 and the metal block 17 is filled with thermosetting resin exuded from the prepreg.

Figure 7C:
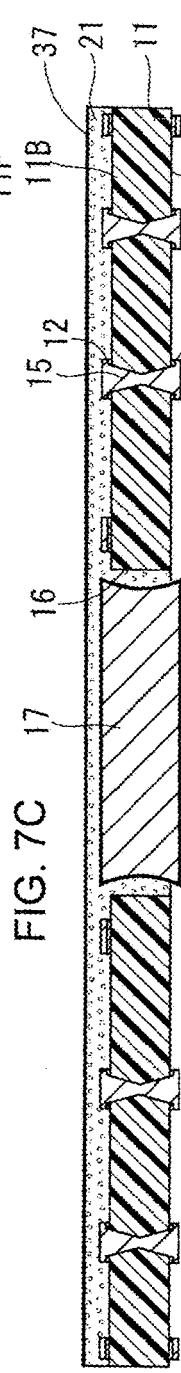

(13) As illustrated in FIG. 7C, the tape 90 is removed.

Figure 7D:
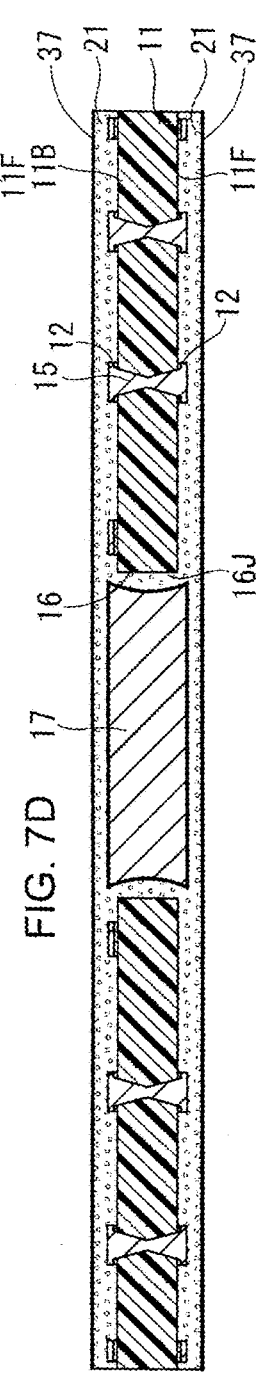

(14) As illustrated in FIG. 7D, a prepreg as the first insulating resin layer 21 and a copper foil 37 are laminated on the conductor circuit layer 12 on the F surface (11F) of the core substrate 11, and then, the resulting substrate is hot-pressed. In doing so, spacing between the conductor circuit layers (12, 12) on the F surface (11F) of the core substrate 11 is filled with the prepreg, and a gap between an inner surface of the cavity 16 and the metal block 17 is filled with thermosetting resin exuded from the prepreg. Further, the above-described filling resin (16J) is formed by the thermosetting resin that exudes from the prepregs on the F surface (11F) and the B surface (11B) of the core substrate 11 and is filled in the gap between the inner surface of the cavity 16 and the metal block 17.

Instead of the prepreg, it is also possible to use a resin film that does not contain a core material as the first insulating resin layer 21. In this case, without laminating a copper foil, a conductor circuit layer can be directly formed on a surface of the resin film using a semi-additive method.

(15) As illustrated in FIG. 8A, the via holes (21H) are formed by irradiating CO2 laser to the first insulating resin layers (21, 21) that are respectively formed on the front and back sides of the core substrate 11 by the prepregs. Among the via holes (21H), some via holes (21H) are formed on the conductor circuit layers 12 and other via holes (21H) are formed on the metal block 17. When the via holes (21H) are formed on the metal block 17, unevenness of the rough surface of the metal block 17 positioned on a deep side of the via holes (21H) may be eliminated by laser irradiation or by desmear after laser irradiation.

(16) An electroless plating treatment is performed. Electroless plating films (not illustrated in the drawings) are formed on the first insulating resin layers (21, 21) and in the via holes (21H, 21H).

(17) As illustrated in FIG. 8B, plating resists 40 of predetermined patterns are respectively formed on the electroless plating films on the copper foils 37.

(18) An electrolytic plating treatment is performed. As illustrated in FIG. 8C, the via holes (21H, 21H) are filled with plating and the via conductors (21D, 21D) are formed. Further, electrolytic plating films (39, 39) are formed on portions of the electroless plating films (not illustrated in the drawings) on the first insulating resin layers (21, 21), the portions being exposed from the plating resists 40.

(19) The plating resists 40 are removed, and the electroless plating films (not illustrated in the drawings) and the copper foils 37, which are below the plating resists 40, are removed. As illustrated in FIG. 9A, the first conductor layers 22 are respectively formed on the first insulating resin layers 21 on the front and back sides of the core substrate 11 by the remaining electrolytic plating films 39, electroless plating films and copper foils 37. Then, a state is achieved in which, on each of the front and back sides of the core substrate 11, a portion of the first conductor layer 22 and the conductor circuit layer 12 are connected by the via conductors (21D), and the other portion of the first conductor layer 22 and the metal block 17 are connected by the via conductors (21D).

(20) By the same processing as described in the above (12)-(19), as illustrated in FIG. 9B, a state is achieved in which, on each of the front and back sides of the core substrate 11, the second insulating resin layer 23 and the second conductor layer 24 are formed on the first conductor layer 22, and a portion of the second conductor layer 24 and the first conductor layer 22 are connected by the via conductors (23D).

(21) As illustrated in FIG. 9C, the solder resist layers (25, 25) are respectively laminated on the second conductor layers 24 on the front and back sides of the core substrate 11.

Figure 10:
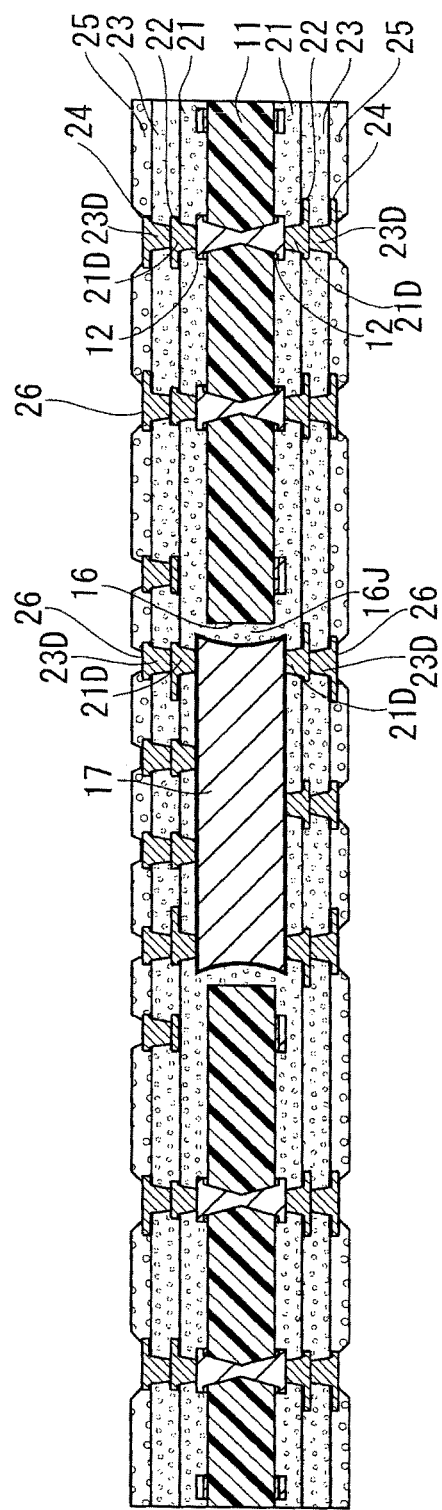
FIG. 10 is cross-sectional side view illustrating a manufacturing process of the circuit substrate.

(22) As illustrated in FIG. 10, tapered pad holes are formed at predetermined places on the solder resist layers (25, 25) on the front and back sides of the core substrate 11, and portions of the second conductor layers 24 on the front and back sides of the core substrate 11 that are exposed from the pad holes become the pads 26.

(23) On each of the pads 26, a nickel layer, a palladium layer and a gold layer are laminated in this order and a metal film 41 illustrated in FIG. 3 is formed. As a result, the circuit substrate 10 is completed. Instead of the metal film 41, it is also possible to perform surface treatment using OSP (pre-flux).

Next, a method for manufacturing the metal block 17 is described based on FIGS. 11 and 12A-12E.

Figure 11:
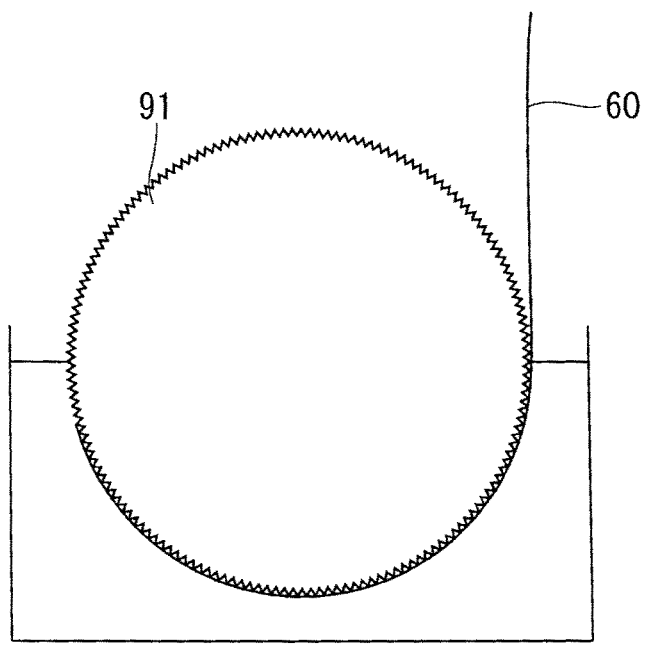
FIG. 11 is a side view illustrating a manufacturing process of an electrolytic copper foil.

(1) As illustrated in FIG. 11, copper is electrodeposited on an electrode 91, of which a surface is a rough surface, and an electrolytic copper foil 60 is formed. In this case, of front and back surfaces of the electrolytic copper foil 60, a surface on a side in contact with the electrode becomes a rough surface due to that a shape of the rough surface of the electrode is transferred to this surface of the electrolytic copper foil 60. On the other hand, a surface of the electrolytic copper foil 60 on an opposite side of the roughened surface is relatively smooth.

(2) The electrolytic copper foil 60 of (1) is immersed for a predetermined period of time in an acid solution (for example, an acid of which main components are sulfuric acid and hydrogen peroxide) stored in a storage tank and thereafter is washed with water. As a result, a copper plate 50 is formed, of which front and back surfaces are rough surfaces and have different roughness.

Figure 12A:
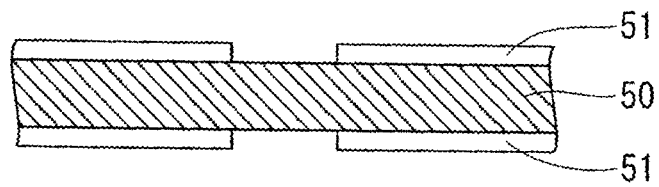
FIG. 12A-12E are cross-sectional side views illustrating manufacturing processes of a metal block.

(3) As illustrated in FIG. 12A, an etching resist 51 of a predetermined pattern is formed on the front and back surfaces of the copper plate 50.

Figure 12B:
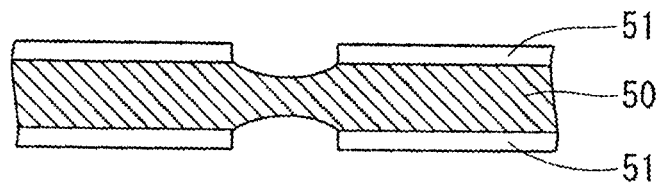

(4) As illustrated in FIG. 12B, a portion of the copper plate 50 that is exposed from the etching resist 51 is half-etched by an etching process.

Figure 12C:
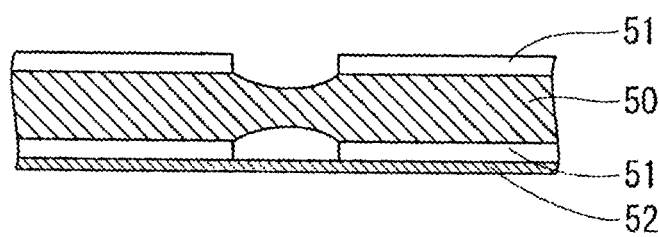

(5) As illustrated in FIG. 12C, the copper plate 50 is affixed to a support member 52. In this case, the copper plate 50 is positioned such that, for example, the surface having a larger roughness faces downward.

Figure 12D:
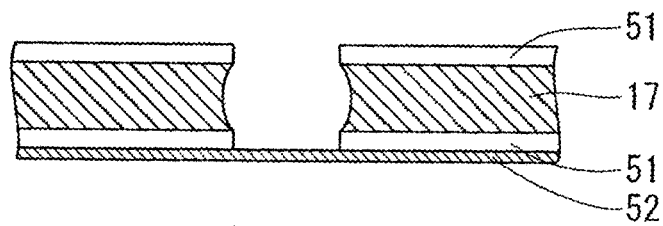

(6) As illustrated in FIG. 12D, the portion of the copper plate 50 that is exposed from the etching resist 51 is cut by an etching process. As a result, the metal block 17 is formed. Further, the etching process is performed until a side surface of the metal block 17 becomes the groove-shaped side surface (17A). That is, both the cutting of the copper plate 50 and the formation of the groove-shaped side surfaces (17A) are performed in one etching process. An "etching surface" in an embodiment of the present invention refers to a surface formed by etching.

Figure 12E:
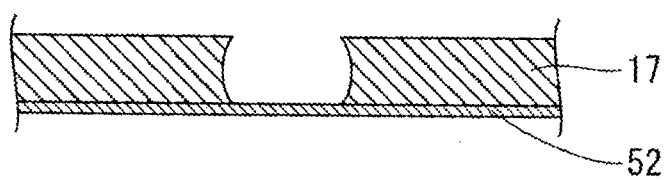

(7) In a state of being affixed to the support member 52, each metal block 17 is immersed for a predetermined period of time in a peeling solution (for example, an aqueous solution of sodium hydroxide) and thereafter is washed with water. As a result, as illustrated in FIG. 12E, the etching resist 51 is peeled off, and multiple metal blocks 17 are aligned on the support member 52 in a state in which the surface (first primary surface (17F)) having a larger roughness faces downward.

(8) The metal blocks 17 aligned on the support member 52 are dried.

Figure 13:
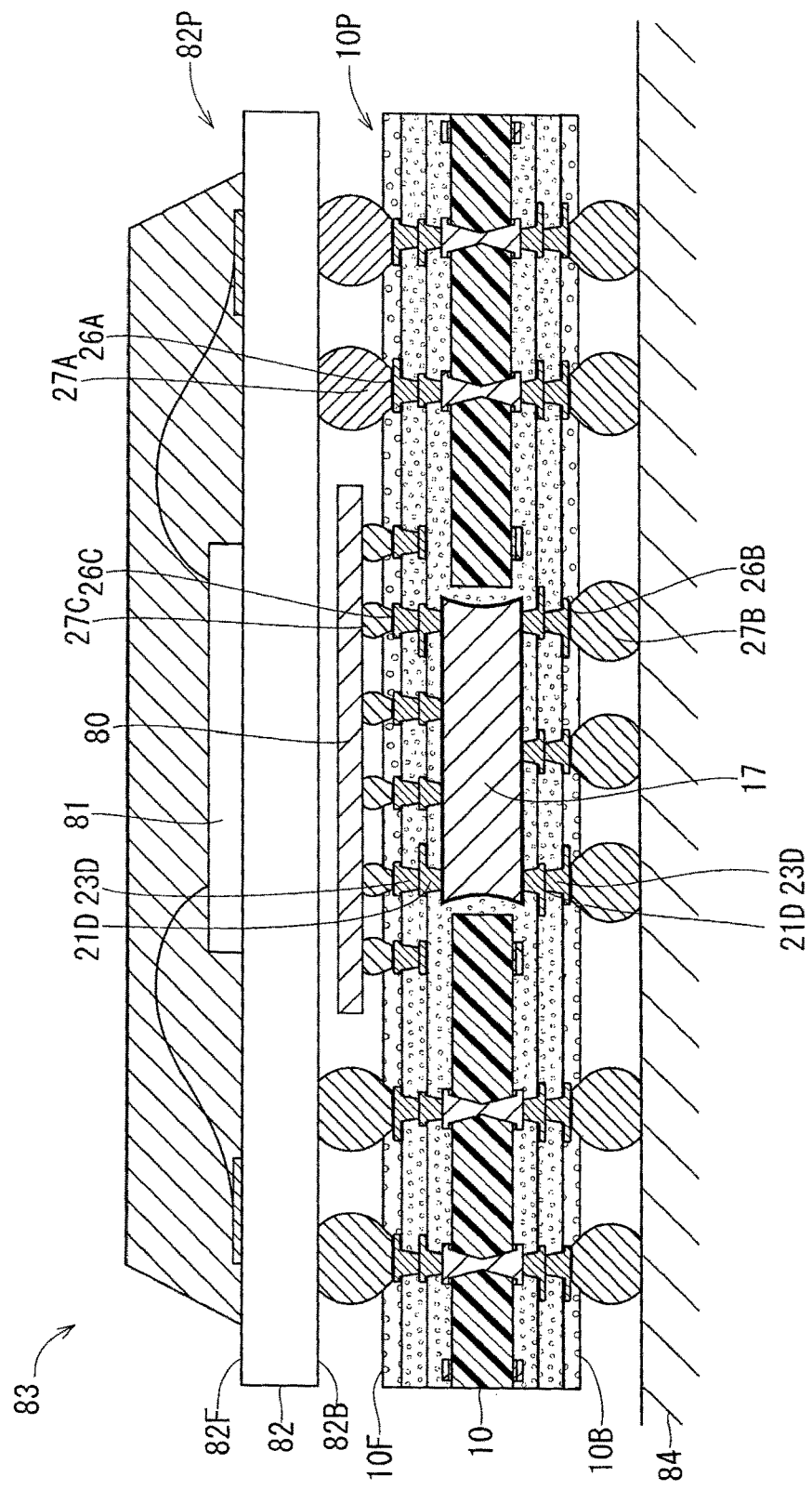
FIG. 13 is a cross-sectional side view of a PoP that includes the circuit substrate.

The description about the structure and the manufacturing method of the circuit substrate 10 of the present embodiment is as given above. Next, an operation effect of the circuit substrate 10 is described together with an example of use of the circuit substrate 10. The circuit substrate 10 of the present embodiment is used, for example, as follows. That is, as illustrated in FIG. 13, large, medium and small solder bumps (27B, 27A, 27C) that respectively match the sizes of the above-described large, medium and small pads (26B, 26A, 26C) of the circuit substrate 10 are respectively formed on the large, medium and small pads (26B, 26A, 26C). Then, for example, a CPU 80 having on a lower surface a pad group that is similarly formed as the small pad group on the F surface (1 0F) of the circuit substrate 10 is mounted on and soldered to the group of the small solder bumps (27C) of each product region (R2), and a first package substrate (10P) is formed. In this case, for example, four pads for grounding that the CPU 80 has are connected via the via conductors (21D, 23D) to the metal block 17 of the circuit substrate 10.

Next, a second package substrate (82P) that is obtained by mounting a memory 81 on an F surface (82F) of a circuit substrate 82 is positioned from an upper side of the CPU 80 on the first package substrate (10P). The medium solder bumps (27A) of the circuit substrate 10 of the first package substrate (10P) are soldered to pads that are provided on a B surface (82B) of the circuit substrate 82 of the second package substrate (82P). Thereby, a PoP 83 (Package on Package 83) is formed. Spacing between the circuit substrates (10, 82) in the PoP 83 is filled with a resin (not illustrated in in the drawings).

Next, the PoP 83 is positioned on a motherboard 84. The large solder bumps (27B) on the circuit substrate 10 of the PoP 83 are soldered to a pad group that the motherboard 84 has. In this case, for example, a pad for grounding that the motherboard 84 has is soldered to a pad 26 of the circuit substrate 10 that is connected to the metal block 17. When the CPU 80 and the motherboard 84 have pads dedicated to heat dissipation, the pads dedicated to heat dissipation and the metal block 17 of the circuit substrate 10 may be connected to each other via the via conductors (21D, 23D).

When the CPU 80 generates heat, the heat is transmitted to the metal block 17 via the via conductors (21D, 23D) contained in the build-up layer 20 on the F surface (10F) side of the circuit substrate 10 on which the CPU 80 is mounted, and is dissipated from the metal block 17 to the motherboard 84 via the via conductors (21D, 23D) contained in the build-up layer 20 on the B surface (10B) side of the circuit substrate 10. Here, in the circuit substrate 10 of the present embodiment, the number of the via conductors (21D) that are connected to the metal block 17 is greater in the build-up layer 20 on the F surface (11F) side, on which the CPU 80 is mounted, than in the build-up layer 20 on the B surface (10B) side, to which the motherboard 84 as a heat dissipation destination is connected. Therefore, heat transmission from the CPU 80 to the metal block 17 can be efficiently performed.

However, the circuit substrate 10 repeats thermal expansion and contraction due to use and non-use of the CPU 80. Then, due to a difference in thermal expansion coefficient between the metal block 17 and the first insulating resin layer 21 of the build-up layer 20, a shear force acts between the metal block 17 and the first insulating resin layer 21 of the build-up layer 20, and there is a concern that the first insulating resin layer 21 and the via conductors (21D) may peel off from the metal block 17. However, in the circuit substrate 10 of the present embodiment, both the front and back surfaces (the first primary surface (17F) and the second primary surface (17B)) of the metal block 17 that are covered by the first insulating resin layers (21, 21) are formed as rough surfaces. Therefore, peeling between the metal block 17 and the first insulating resin layers (21, 21) can be suppressed, and the fixation of the metal block 17 in the circuit substrate 10 can be stabilized. Further, by roughening the surfaces of the metal block 17, a contact area between the metal block 17 and the first insulating resin layers (21, 21) and the filling resin (16J) in the cavity 16 is increased, and efficiency of heat dissipation from the metal block 17 to the circuit substrate 10 is increased.

Further, the front and back surfaces of the metal block 17 have different roughness. The surface (first primary surface (17F)) having a relatively larger roughness is connected to the CPU 80, and the surface (second primary surface (17B)) having a relatively smaller roughness is connected to the motherboard 84. Therefore, on the first primary surface (17F) side for which a thermal stress is large, peeling between the metal block 17 and the first insulating resin layer 21 can be further suppressed.

Further, the side surface of the metal block 17 is the groove-shaped side surface (17A) that is curved so as to increase in depth toward the center. Therefore, a contact area between the metal block 17 and the filling resin (16J) can be increased as compared to a case where the side surface of the metal block 17 is a flat surface, and thus the fixing strength can be increased as compared to a conventional case.

Further, when processing from the copper plate 50 to the metal block 17 is performed by press processing or the like, the outer edge of the metal block 17 sags and there is a risk that a portion protruding from the first primary surface (17F) or second primary surface (17B) may come into contact with the first conductor layer 22 and short circuiting may occur. In contrast, in the circuit substrate 10 of the present embodiment, the processing from the copper plate 50 to the metal block 17 is performed by an etching process. Therefore, the outer edge of the metal block 17 can be prevented from protruding from the first primary surface (17F) or second primary surface (17B), and occurrence of short circuiting can be prevented.

Second Embodiment

Figure 14:
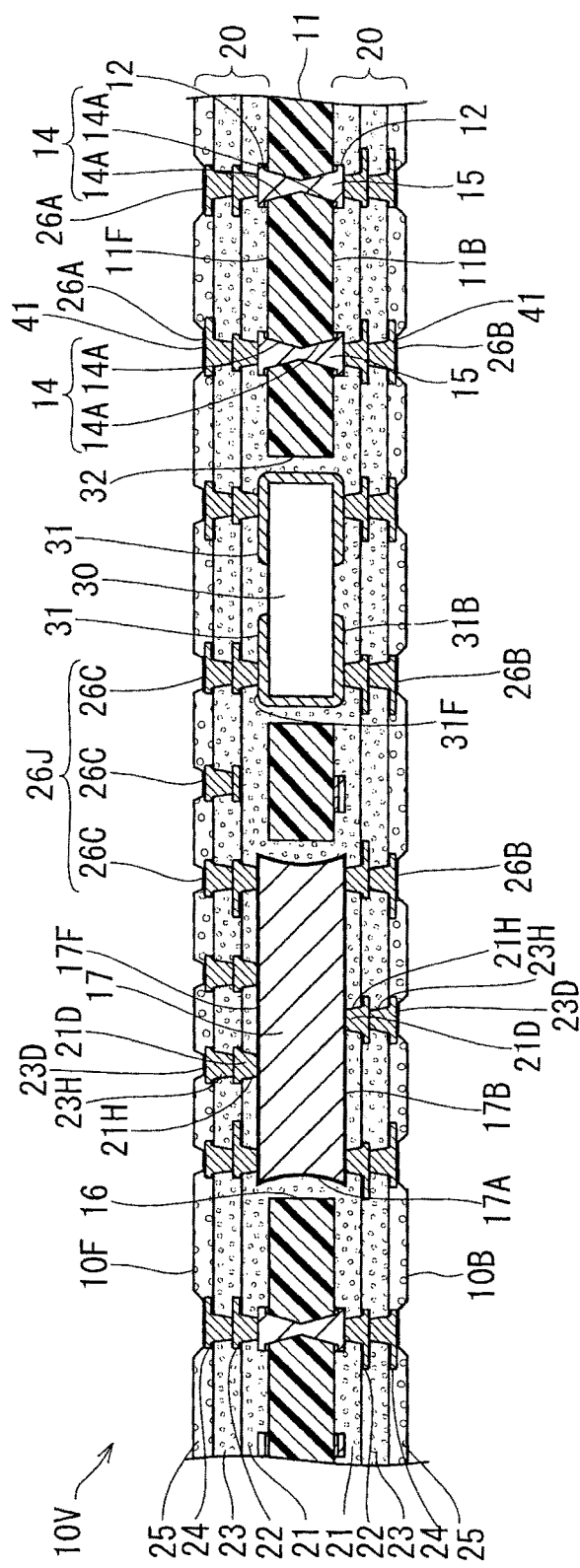
FIG. 14 is a cross-sectional side view of a circuit substrate of a second embodiment.

A circuit substrate (10V) of the present embodiment is illustrated in FIG. 14. In the circuit substrate (10V), multiple cavities 32 that each accommodate a multilayer ceramic capacitor 30 are provided near the cavity 16 that accommodates the metal block 17. The multilayer ceramic capacitor 30 has a structure in which, for example, two end portions of a ceramic prismatic body are covered by a pair of electrodes (31, 31). Further, similar to the metal block 17, each multilayer ceramic capacitor 30 slightly protrudes from the F surface (11F) and the B surface (11B) of the core substrate 11. A first flat surface (31F) of each of the electrodes 31 of the multilayer ceramic capacitor 30 is flush with the outermost surface of the conductor circuit layer 12 on the F surface (11F) side of the core substrate 11, and a second flat surface (31B) of each of the electrodes 31 of the multilayer ceramic capacitor 30 is flush with the outermost surface of the conductor circuit layer 12 on the B surface (11B) side of the core substrate (11W). The multilayer ceramic capacitor 30 is positioned below the electronic component mounting part (26J). Then, the via conductors (21D, 23D) contained in the build-up layers (20, 20) of both the front and back surfaces of the core substrate 11 are connected to the electrodes 31 of each of the multilayer ceramic capacitors 30. Further, when the circuit substrate (10V) is manufactured, the metal block 17 and the multilayer ceramic capacitors 30 are respectively accommodated in the cavities (16, 32) in the same process. Here, a diameter (top diameter) of via conductors (21D) that connect the electrodes 31 of the multilayer ceramic capacitor 30 and the first conductor layer 22, a diameter (top diameter) of via conductors (21D) that connect the conductor circuit layer 12 and the first conductor layer 22 and a diameter (top diameter) of via conductors (21D) that connect the metal block 17 and the first conductor layer 22 may be substantially the same or may be different.

Other Embodiments

The present invention is not limited to the above-described embodiments. For example, embodiments described below are also included in the technical scope of the present invention. Further, in addition to the embodiments described below, the present invention can also be embodied in various modified forms within the scope without departing from the spirit of the present invention.

(1) The via conductors (21D) of the above-described embodiments are in a state of being connected via the via conductors (23D) to the pads 26 that are exposed from the outermost surfaces of the circuit substrate (10, 10V). However, for example, it is also possible to have a state in which conductors that are connected to the via conductors (21D) are not connected to portions that are exposed from the outermost surfaces of the circuit substrate (10, 10V), such as a state in which the via conductors (23D) are not connected or the pads 26 are not provided.

(2) In the circuit substrate (10, 10V) of the above-described embodiments, the number of the via conductors (21D) that are connected to the metal block 17 is greater in the build-up layer 20 on the F surface (11F) side of the core substrate 11 than in the build-up layer 20 on the B surface (11B) side. However, it is also possible that the number of the via conductors (21D) is greater in the build-up layer 20 on the B surface (11B) side, or the number is the same in the build-up layers 20 on the two sides.

(3) The front and back surfaces of the metal block 17 in the above-described embodiments are roughened before the copper plate 50 is cut. However, it is also possible that the roughening is performed after the cutting. In this case, all the surfaces of the metal block 17 are in a state of being roughened.

(4) The surfaces of the metal block of the above-described embodiments are roughened using an acid. However, for example, it is also possible that the roughening of the surfaces is performed by spraying particles or by pressing the surfaces against an uneven surface.

(5) In the above-described embodiments, the electronic components that are accommodated in the cavities 32 are multilayer ceramic capacitors 30. However, other than the multilayer ceramic capacitors 30, other electronic components, for example, passive components such as capacitors, resistors, thermistors and coils, and active components such as IC circuits, and the like, may also be accommodated in the cavities 32.

Figure 15:
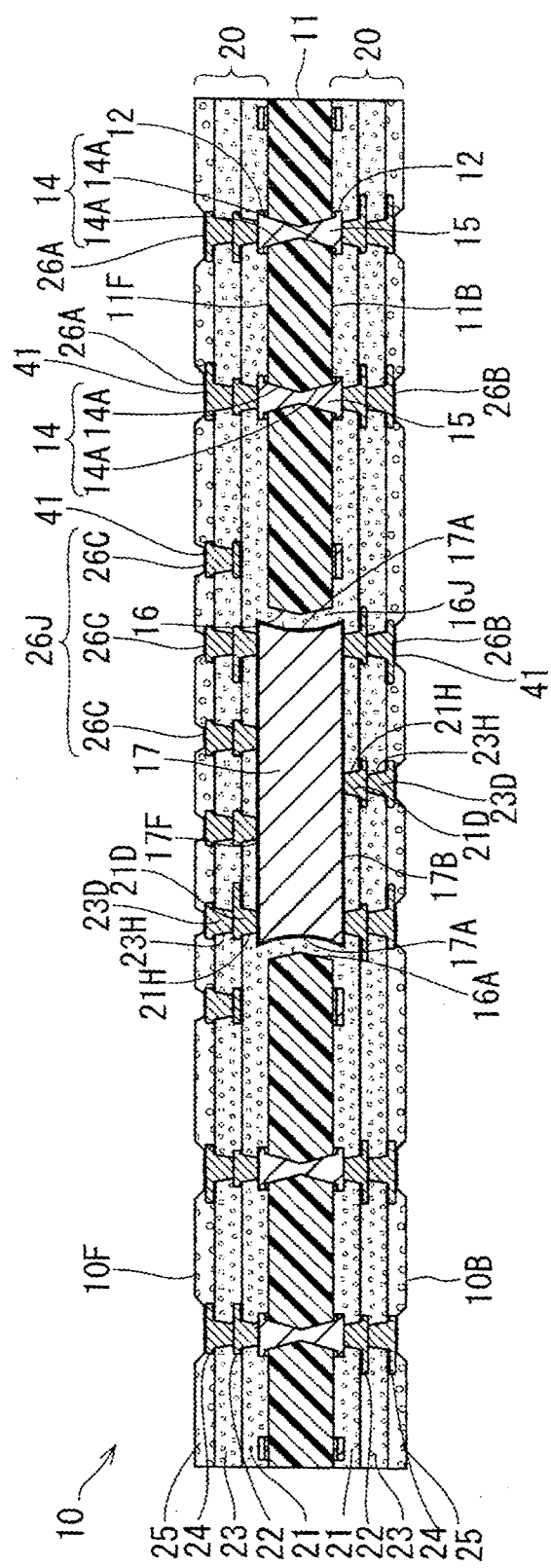
FIG. 15 is a cross-sectional side view of a circuit substrate according to a modified embodiment.

(6) In the above-described embodiments, the inner side surface of the cavity 16 is a flat surface. However, as illustrated in FIG. 15, it is also possible that the cavity 16 has a bulging side surface (16A) that bulges toward the groove-shaped side surface (17A).

Figure 16:
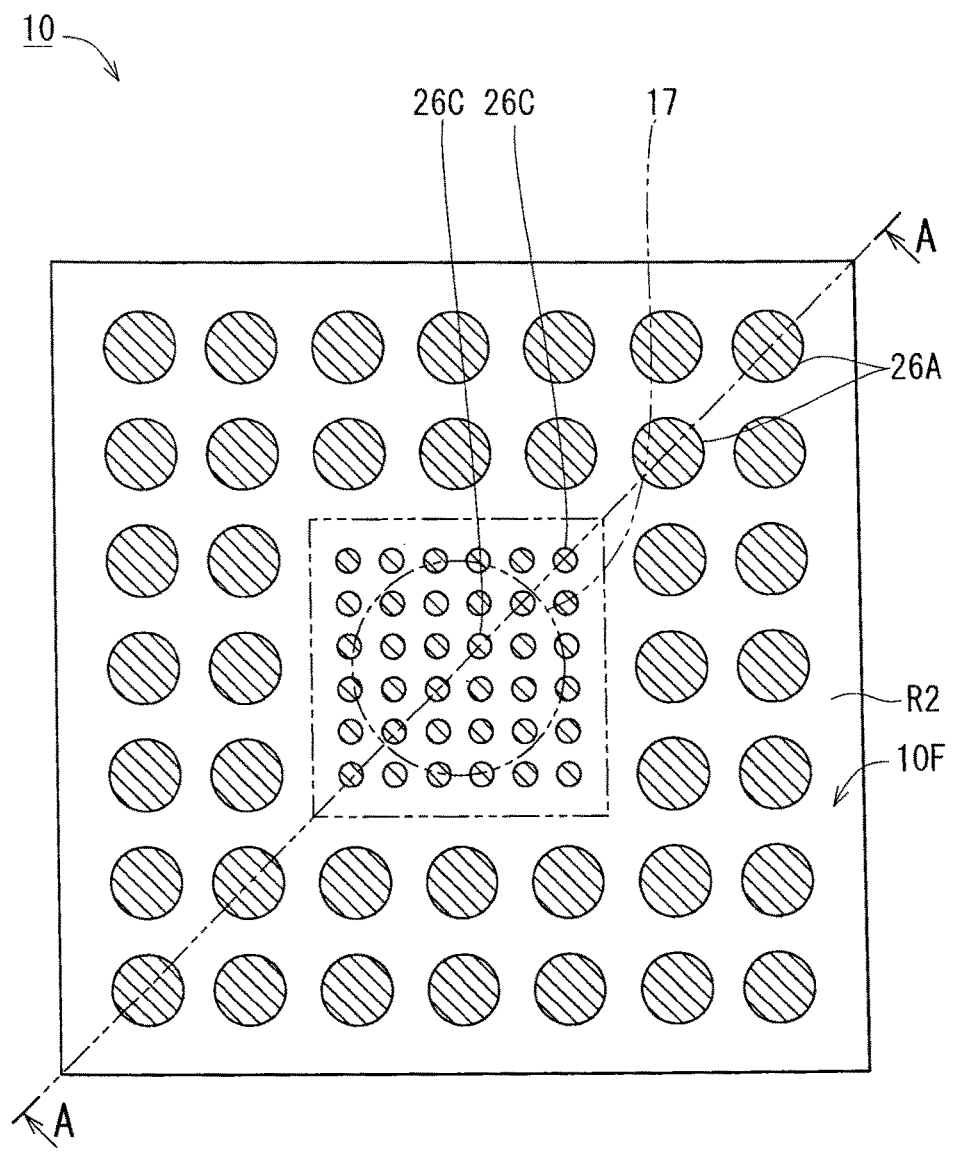
FIG. 16 is a plan view of a product region in the circuit substrate according to the modified embodiment.

(7) The planar shape of the metal block 17 in the above-described embodiments is rectangular. However, the planar shape of the metal block 17 may also be other polygonal shapes, and may also be circular as illustrated in FIG. 16, and may also be elliptical or oval.

(8) The metal block 17 in the above-described embodiments is made of copper. However, the present invention is not limited to this. For example, the metal block 17 may also be made of a mixture of copper and molybdenum or tungsten, or made of aluminum or the like.

(9) In the above-described embodiments, the distance between the first primary surface (17F) and the second primary surface (17B) of the metal block 17 is larger than the plate thickness of the core substrate 11. However, it is also possible that the distance between the first primary surface (17F) and the second primary surface (17B) of the metal block 17 is the same as the plate thickness of the core substrate 11 or is smaller than the plate thickness of the core substrate 11.

(10) In the above-described embodiments, when a metal block 17 is accommodated in the cavity 16 using a mounter, multiple metal blocks 17 are positioned in advance in a state in which the first primary surface (17F) (surface having a larger roughness) of each of the metal blocks 17 faces downward. However, it is also possible to have a structure in which the metal blocks 17 are placed in a state in which the position of the front and back surfaces of the metal blocks 17 is random and a metal block 17 with a surface of larger roughness facing downward is selected to be accommodated in the cavity 16, or the difference in roughness is distinguished so that a metal block 17 with a surface of larger roughness facing downward is directly accommodated in the cavity 16, and a metal block 17 with a surface of smaller roughness facing downward is turned upside down and is then accommodated in the cavity 16. In the latter case, it is also possible to have a structure in which, for example, a mark such as a color is attached to one side of the copper plate 50, and the mark is used as a clue to distinguish the difference in roughness.

(11) In the above-described embodiments, the first primary surface (17F) has an arithmetic average roughness (Ra) of 2.1 µm and the second primary surface (17B) has an arithmetic average roughness (Ra) of 0.16 µm. However, as long as the roughness of the first primary surface (17F) of the metal block 17 is greater than the roughness of the second primary surface (17B), the arithmetic average roughness (Ra) values are not limited to the above values. Preferably, it is appropriate that the arithmetic average roughness of the first primary surface (17F) is in a range of 1.0-3.0 µm and the arithmetic average roughness of the second primary surface (17B) is in a range of 0.1-1.0 µm.

(12) In the above-described embodiments, the side surface of the metal block 17 is curved. However, it is also possible to have a structure in which the side surface of the metal block 17 is orthogonal to the first primary surface (17F) and the second primary surface (17B).

In a circuit substrate, there may be a problem that the insulating resin layers are peeled off from a metal block so that fixing strength of the metal block is reduced.

A circuit substrate according to an embodiment of the present invention is capable of suppressing peeling of an insulating resin layer from a metal block, and another embodiment of the present invention is a method for manufacturing such a circuit substrate.

A circuit substrate according to one aspect of the present invention includes: a core substrate; a cavity that penetrates the core substrate; a metal block that is accommodated in the cavity; build-up layers that are respectively laminated on front and back sides of the core substrate and respectively include insulating resin layers that cover the cavity; a filling resin that is filled in a gap between the cavity and the metal block; and an electronic component mounting part that is provided on an outermost part of the build-up layer that is laminated on the front side of the core substrate, an electronic component being mounted on the electronic component mounting part. Front and back surfaces of the metal block that are covered by the build-up layers and are in contact with resin are rough surfaces, and one of the front and back surfaces that is on the electronic component mounting part side has a roughness larger than that of the other surface on an opposite side.

Obviously, numerous modifications and variations of the present invention are possible in light of the above teachings. It is therefore to be understood that within the scope of the appended claims, the invention may be practiced otherwise than as specifically described herein.

What is claimed is:

1. A circuit substrate, comprising:
a core substrate comprising resin material and having a cavity formed such that the cavity is penetrating through the core substrate;
a metal block accommodated in the cavity of the core substrate and having a thickness greater than a thickness of the core substrate such that the metal block has a first surface and a second surface protruding from a first side and a second side of the core substrate respectively;
a first build-up layer laminated on the first side of the core substrate and comprising a plurality of insulating resin layers such that the first build-up layer is covering the first surface of the metal block in the cavity of the core substrate from the first side, and a first via conductor structure formed in an innermost portion of the first build-up layer such that the first via conductor structure is connected to the first surface of the metal block; and
a second build-up layer laminated on the second side of the core substrate on an opposite side with respect to the first side and comprising a plurality of insulating resin layers such that the second build-up layer is covering the second surface of the metal block in the cavity of the core substrate from the second side, and a second via conductor structure formed in an innermost portion of the second build-up layer such that the second via conductor structure is connected to the second surface of the metal block,
wherein the first build-up layer comprises an electronic component mounting structure formed on an outermost portion of the first build-up layer such that the electronic component mounting structure mounts an electronic component on the first build-up layer, the metal block is formed such that the first and second surfaces of the metal block comprise roughened surfaces in contact with respective insulating resin layers in the first and second build-up layers and that the roughened surface of the first surface has a surface roughness in a range of 1.0 µm to 3.0 µm in an arithmetic average roughness which is different from a surface roughness of the roughened surface of the second surface in a range of 0.1 µm to 1.0 µm in an arithmetic average roughness, and the first and second via conductor structures are formed such that the first via conductor structure comprises a plurality of via conductors which is greater in number than a plurality of via conductors forming the second via conductor structure.

2. A circuit substrate according to claim 1, wherein the metal block is formed such that the first surface is smaller than a surface of the electronic component to be mounted to the electronic component mounting structure and that the roughened surface of the first surface has the surface roughness which is greater than the surface roughness of the roughened surface of the second surface.

3. A circuit substrate according to claim 2, wherein the second build-up layer has a substrate connecting structure formed on an outermost portion of the second build-up layer such that the substrate connecting structure connects to another circuit substrate on the second build-up layer.

4. A circuit substrate according to claim 3, wherein the first and second via conductor structures are formed such that the via conductors of the first via conductor structure are positioned between the first surface of the metal block and the electronic component mounting structure in the first build-up layer.

5. A circuit substrate according to claim 1, wherein the second build-up layer has a substrate connecting structure formed on an outermost portion of the second build-up layer such that the substrate connecting structure connects to another circuit substrate on the second build-up layer.

6. A circuit substrate according to claim 5, wherein the first and second via conductor structures are formed such that the via conductors of the first via conductor structure are positioned between the first surface of the metal block and the electronic component mounting structure in the first build-up layer.

7. A circuit substrate according to claim 1, wherein the metal block has a side surface formed between the first surface and the second surface such that the side surface has a groove form recessed along the first surface and the second surface of the metal block and extending from the first surface and the second surface of the metal block.

8. A circuit substrate according to claim 1, wherein the metal block has a side surface comprising an etched surface formed between the first surface and the second surface such that the side surface has a groove form recessed along the first surface and the second surface of the metal block and extending from the first surface and the second surface of the metal block.

9. A circuit substrate according to claim 1, further comprising:
a built-in electronic component accommodated in the core substrate such that the built-in electronic component is positioned in a second cavity penetrating through the core substrate.

10. A method for manufacturing a circuit substrate, comprising:
forming a cavity in a core substrate comprising resin material such that the cavity penetrates through the core substrate;
accommodating, in the cavity of the core substrate, a metal block having a thickness greater than a thickness of the core substrate and having first and second surfaces comprising roughened surfaces, respectively, such that the metal block has the first and second surfaces protruding from a first side and a second side of the core substrate respectively and that the roughened surface of the first surface has a surface roughness in a range of 1.0 µm to 3.0 µm in an arithmetic average roughness which is different from a surface roughness of the roughened surface of the second surface in a range of 0.1 µm to 1.0 µm in an arithmetic average roughness;
forming, on the first side of the core substrate, a first build-up layer comprising a plurality of insulating resin layers such that the first build-up layer covers the first surface of the metal block in the cavity of the core substrate from the first side and an insulating resin layer in the first build-up layer is in contact with the roughened surface of the first surface of the metal block; and
forming, on the second side of the core substrate, a second build-up layer comprising a plurality of insulating resin layers on an opposite side with respect to the first side such that the second build-up layer covers the second surface of the metal block in the cavity of the core substrate from the second side and an insulating resin layer in the second build-up layer is in contact with the roughened surface of the second surface of the metal block,
wherein the forming of the first build-up layer comprises forming an electronic component mounting structure on an outermost portion of the first build-up layer such that the electronic component mounting structure mounts an electronic component on the first build-up layer and forming a first via conductor structure in an innermost portion of the first build-up layer such that the first via conductor structure is connected to the first surface of the metal block, the forming of the second build-up layer comprises forming a second via conductor structure in an innermost portion of the second build-up layer such that the second via conductor structure is connected to the second surface of the metal block, and the first and second via conductor structures are formed such that the first via conductor structure comprises a plurality of via conductors which is greater in number than a plurality of via conductors forming the second via conductor structure.

11. A method for manufacturing a circuit substrate according to claim 10, wherein the accommodating of the metal block comprises accommodating, in the cavity of the core substrate, the metal block such that the first surface is smaller than a surface of the electronic component to be mounted to the electronic component mounting structure and that the roughened surface of the first surface has the surface roughness which is greater than the surface roughness of the roughened surface of the second surface.

12. A method for manufacturing a circuit substrate according to claim 10, wherein the forming of the first build-up layer comprises forming a substrate connecting structure on an outermost portion of the second build-up layer such that the substrate connecting structure connects to another circuit substrate on the second build-up layer.

13. A method for manufacturing a circuit substrate according to claim 12, wherein the first and second via conductor structures are formed such that the via conductors of the first via conductor structure are positioned between the first surface of the metal block and the electronic component mounting structure in the first build-up layer.

14. A method for manufacturing a circuit substrate according to claim 10, wherein the metal block has a side surface formed between the first surface and the second surface such that the side surface has a groove form recessed along the first surface and the second surface of the metal block and extending from the first surface and the second surface of the metal block.

15. A method for manufacturing a circuit substrate according to claim 10, wherein the metal block has a side surface comprising an etched surface fixated between the first surface and the second surface such that the side surface has a groove form recessed along the first surface and the second surface of the metal block and extending from the first surface and the second surface of the metal block.

16. A method for manufacturing a circuit substrate according to claim 10, further comprising:
providing a metal plate having first and second surfaces comprising roughened surfaces, respectively, such that the first surface of the metal plate has a surface roughness which is greater than a surface roughness of the second surface of the metal plate;

forming, on the first and second surfaces of the metal plate, etching resist layers, respectively, such that each of the etching resist layers has a cut pattern exposing part of the first and second surfaces of the metal plate; and etching the part of the first and second surfaces of the metal plate exposed by the cut patterns on the first and second surfaces of the metal plate such that the metal plate is cut to form the metal block.

17. A method for manufacturing a circuit substrate according to claim 16, wherein the etching of the metal plate comprises etching the metal plate a half way through the cutting, attaching the metal plate to a support device, and etching the metal plate attached to the support device such that the metal plate is cut to form the metal block.

18. A method for manufacturing a circuit substrate according to claim 16, wherein the providing of the metal plate comprises electrodepositing a metal onto a roughened surface of an electrode such that an electrolytic metal foil is formed to have a first surface having a greater surface roughness on an electrode side than a second surface on an opposite side with respect to the electrode side.

19. A method for manufacturing a circuit substrate according to claim 10, further comprising:

forming a second cavity in the core substrate such that the second cavity penetrates through the core substrate; and accommodating a built-in electronic component in the second cavity of the core substrate such that the built-in electronic component is positioned in the second cavity penetrating through the core substrate.

20. A method for manufacturing a circuit substrate according to claim 10, wherein at least one of the forming of the first build-up layer and the forming of the second build-up layer comprises filling a space formed between the core substrate and the metal block in the cavity such that a resin material from at least one of the first and second build-up layer enters into the space formed between the core substrate and the metal block in the cavity.

* * * * *